(12) United States Patent
Liao (10) Patent No.: US 7,994,429 B2
(45) Date of Patent: Aug. 9, 2011

(54) MANUFACTURING METHOD AND STRUCTURE FOR A SUBSTRATE WITH VERTICALLY EMBEDDED CAPACITOR

(75) Inventor: Guo-Cheng Liao, Kaohsiung County (TW)

(73) Assignee: Advanced Semiconductor Engineering, Inc., Nantze Export Processing Zone, Kao-Hsiung (TW)

( * ) Notice: Subject to any disclaimer, the term of this patent is extended or adjusted under 35 U.S.C. 154(b) by 1105 days.

(21) Appl. No.: 11/755,726

(22) Filed: May 30, 2007

(65) Prior Publication Data

US 2008/0053690 A1    Mar. 6, 2008

(30) Foreign Application Priority Data

Aug. 30, 2006  (TW) .............................. 95132072 A (51) Int. Cl.
*H05K 1/16* (2006.01)
*H05K 1/11* (2006.01)

(52) U.S. Cl. .................. 174/260; 174/261; 361/761
(58) Field of Classification Search ............ 174/260, 174/261; 361/761–764
See application file for complete search history.

(56) References Cited

U.S. PATENT DOCUMENTS

7,778,039 B2 *   8/2010   Chen et al. .................. 361/763
* cited by examiner

*Primary Examiner* — Jeremy C Norris
(74) *Attorney, Agent, or Firm* — Winston Hsu; Scott Margo (57) ABSTRACT

A manufacturing method and structure for substrate with vertically embedded capacitors includes the steps of providing a plurality of conductive layers having a first dielectric layer and a leading wire layer formed on the first dielectric layer, providing a plurality of composite layers having a second dielectric layer and a patterned electrode layer formed on the second dielectric layer, laminating the conductive layers and the composite layers to form a block which defines a plurality of substrates with vertically embedded capacitors and a plurality of sawing streets between the substrates, and sawing the block along the sawing streets to singularize the substrates.

11 Claims, 14 Drawing Sheets

MANUFACTURING METHOD AND STRUCTURE FOR A SUBSTRATE WITH VERTICALLY EMBEDDED CAPACITOR

BACKGROUND OF THE INVENTION

1. Field of the Invention

The invention relates to a substrate with embedded capacitors, and more particularly, to a substrate with vertically embedded capacitors.

2. Description of the Prior Art

Figure 1:
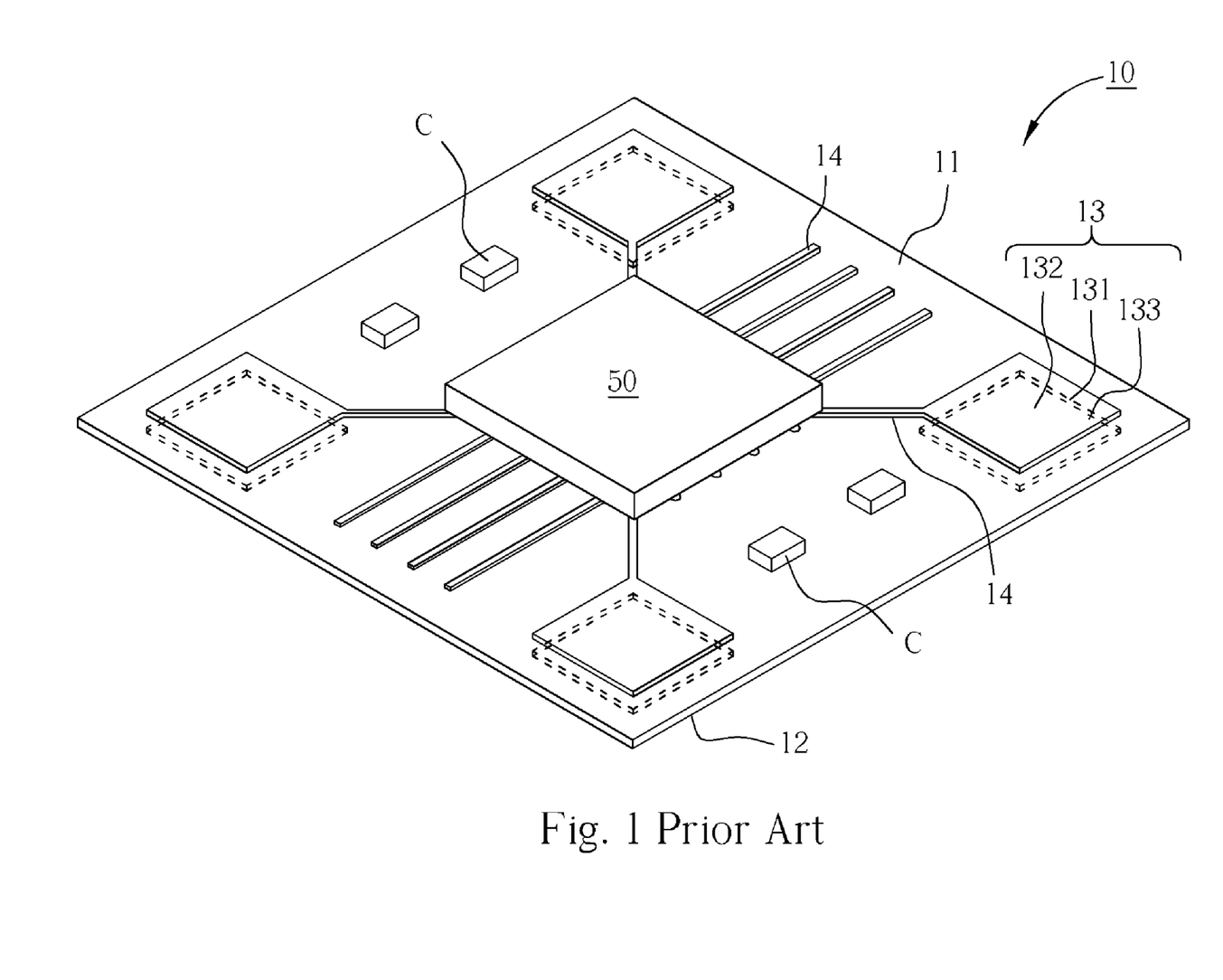
FIG. 1 illustrates a schematic view of a substrate with embedded capacitors according to the prior art.

Referring to FIG. 1, a conventional substrate 10 with embedded capacitors typically includes a top surface 11, a bottom surface 12, a plurality of leading wires 14, and a plurality of embedded capacitors 13 electrically connected to the leading wires 14. The embedded capacitors 13 further includes a first electrode 131, a dielectric layer 132, and a second electrode 133, in which the first electrode 131 and the second electrodes 132 are disposed in a parallel manner on the top surface 11 and the bottom surface 12 respectively. A chip 50 is electrically connected to the embedded capacitors 13 through the leading wires 14. Preferably, the layout of the first electrode 131 and the second electrode 133 of the embedded capacitors 13 is designed with respect to a horizontal manner, in which the electrodes are placed in a parallel manner on the top surface 11 and the bottom surface 12. This design not only reduces the utilization space but also limits the number of embedded capacitors 13 that can be placed on the substrates. If the number of embedded capacitors 13 becomes insufficient and extra capacitors were to be added externally, an additional surface mount process may be required and the overall cost and size of the package would increase accordingly.

SUMMARY OF THE INVENTION

It is an objective of the present invention to provide a substrate with vertically embedded capacitors and method for fabricating the same. Preferably, the method of the present invention not only eliminates the need of using surface mount technique for adding extra capacitors, but also reduces the overall volume and the fabrication cost of the package significantly.

A method for fabricating a substrate with vertically embedded capacitors is disclosed, in which the method includes the steps of providing a plurality of conductive layers having a first dielectric layer and a leading wire layer formed on the first dielectric layer; providing a plurality of composite layers having a second dielectric layer and a patterned electrode layer formed on the second dielectric layer; laminating the conductive layers and the composite layers for forming a block that defines a plurality of substrates with vertically embedded capacitors and a plurality of sawing streets between the substrates; and sawing the block along the sawing streets for singularizing the substrates, in which each of the substrates has a first surface and a second surface.

Another method for fabricating a substrate with vertically embedded capacitors is disclosed, in which the method includes the steps of providing a plurality of conductive layers having a first dielectric layer and a leading wire layer formed on the first dielectric layer; providing a plurality of first composite layers having a second dielectric layer and a patterned electrode layer formed on the second dielectric layer; providing a plurality of second composite layers having a third dielectric layer and a sheet electrode layer formed on the third dielectric layer; laminating the conductive layers, the first composite layers, and the second composite layers for forming a block that defines a plurality of substrates with vertically embedded capacitors and a plurality of sawing streets between the substrates; and sawing the block along the sawing streets for singularizing the substrates, in which each of the substrates has a first surface and a second surface.

According to another aspect of the present invention, a substrate with vertically embedded capacitors is also provided. Specifically, the substrate includes a plurality of conductive layers and a plurality of first composite layers. Each of the conductive layers includes a first dielectric layer and a leading wire layer formed on the first dielectric layer, and each of the first composite layers having a patterned electrode layer and a second dielectric layer is disposed between the conductive layers, in which the patterned electrode layer includes a plurality of electrodes.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
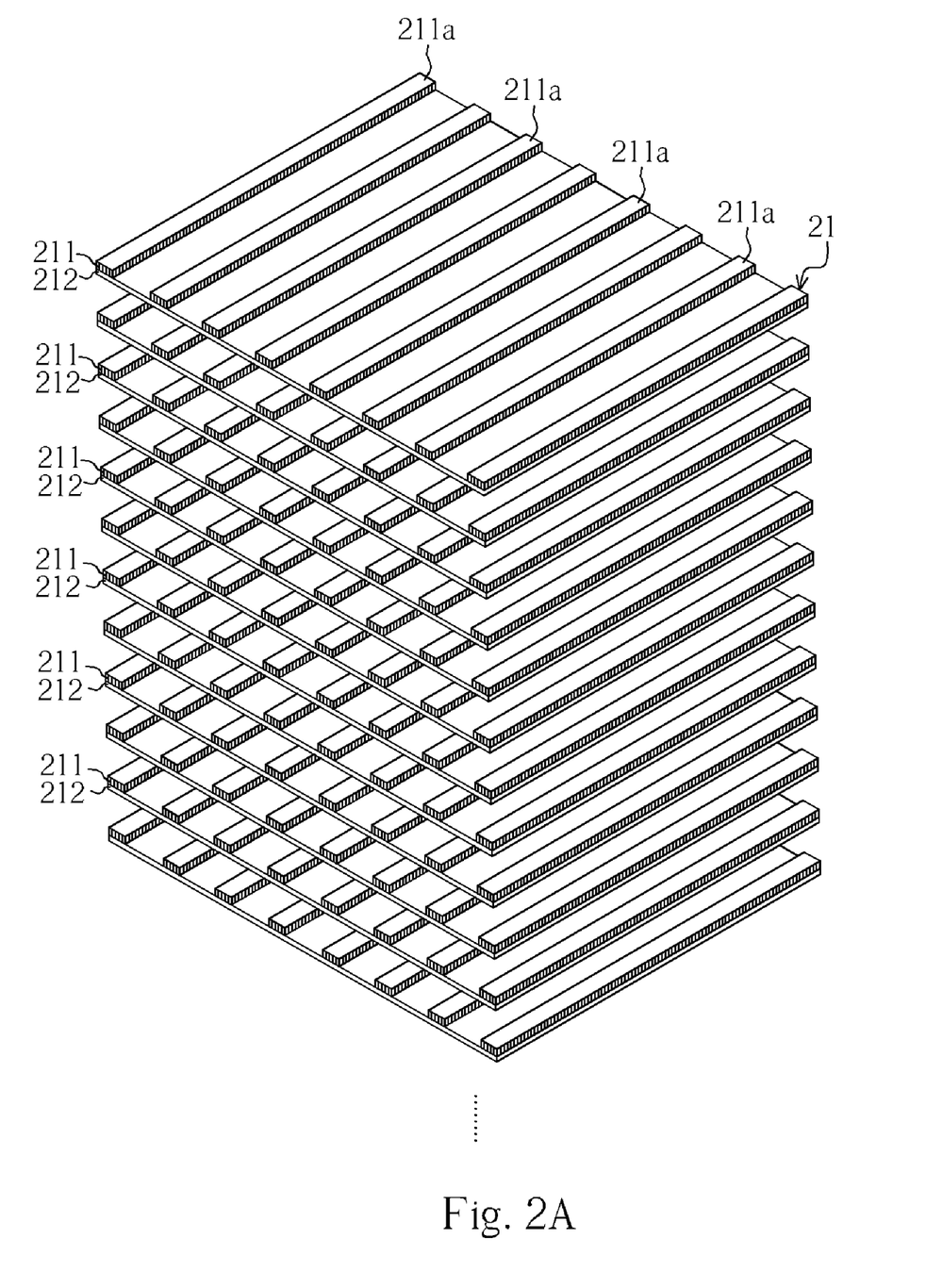
FIGS. 2A-2D illustrate a method for fabricating a substrate with vertically embedded capacitors according the first embodiment of the present invention.
Figure 2B:
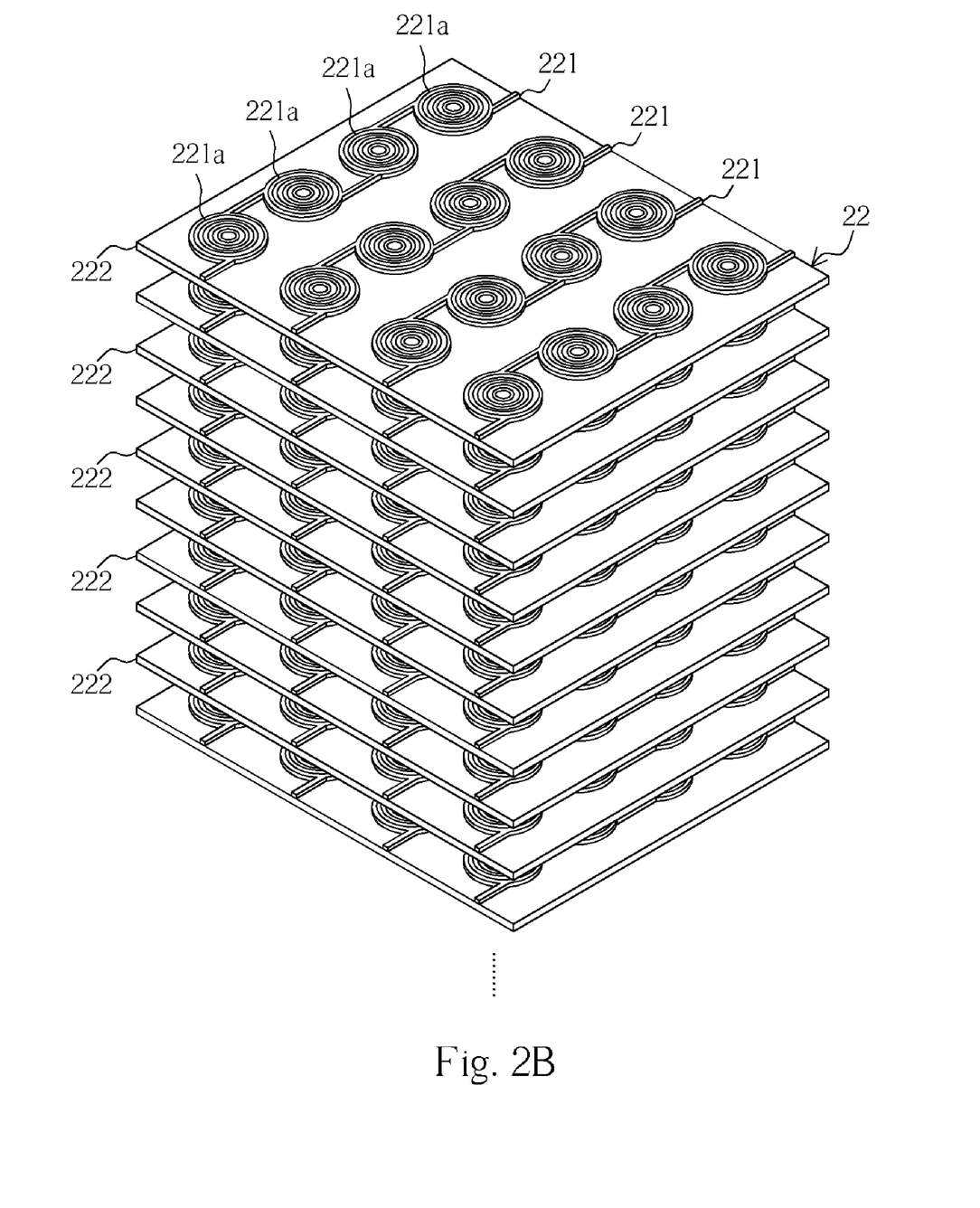
Figure 2C:
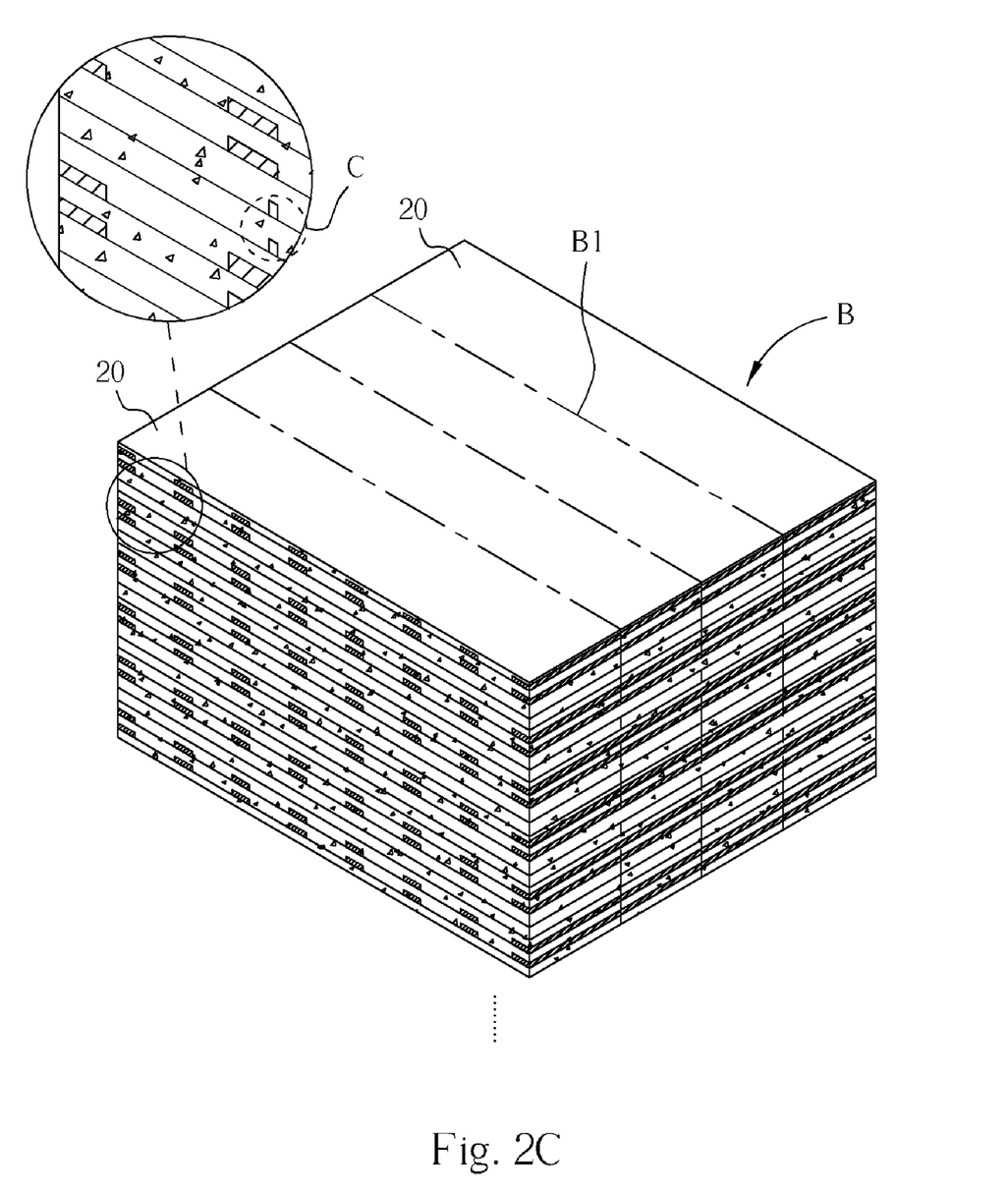

Please refer to FIGS. 2A-2C. FIGS. 2A-2C illustrate a method for fabricating a substrate with vertically embedded capacitors according the first embodiment of the present invention. As shown in FIG. 2A, a plurality of conductive layers 21 is provided, in which each of the conductive layers 21 is composed of a first dielectric layer 212 and a leading wire layer 211 formed thereon. In the present embodiment, the leading wire layer 211 is fabricated from a sheet metal layer via a series of photolithography processes. Preferably, the leading wire layer 211 is composed of a plurality of leading wires 21 1a, in which the leading wires 21 1a are used to replace the conventional through holes of a substrate.

As shown in FIG. 2B, a plurality of composite layers 22 is provided, in which each of the composite layers 22 is composed of a second dielectric layer 222 and a patterned electrode layer 221 formed thereon. Preferably, the patterned electrode layer 221 is also fabricated from a sheet metal layer via a series of photolithography processes (not shown). The patterned electrode layer 221 also includes a plurality of electrodes 221a for forming a plurality of capacitors C, as shown in FIG. 2C. Depending on the demand of the product, the capacitors C can be electrically connected in parallel or series. According to the preferred embodiment of the present invention, the electrodes 221a are arranged in an array, and the second dielectric layers 222 and the first dielectric layers 212 are made of such as epoxy resin, FR4, BT resin, high polymer materials, or ceramic materials.

Figure 2D:
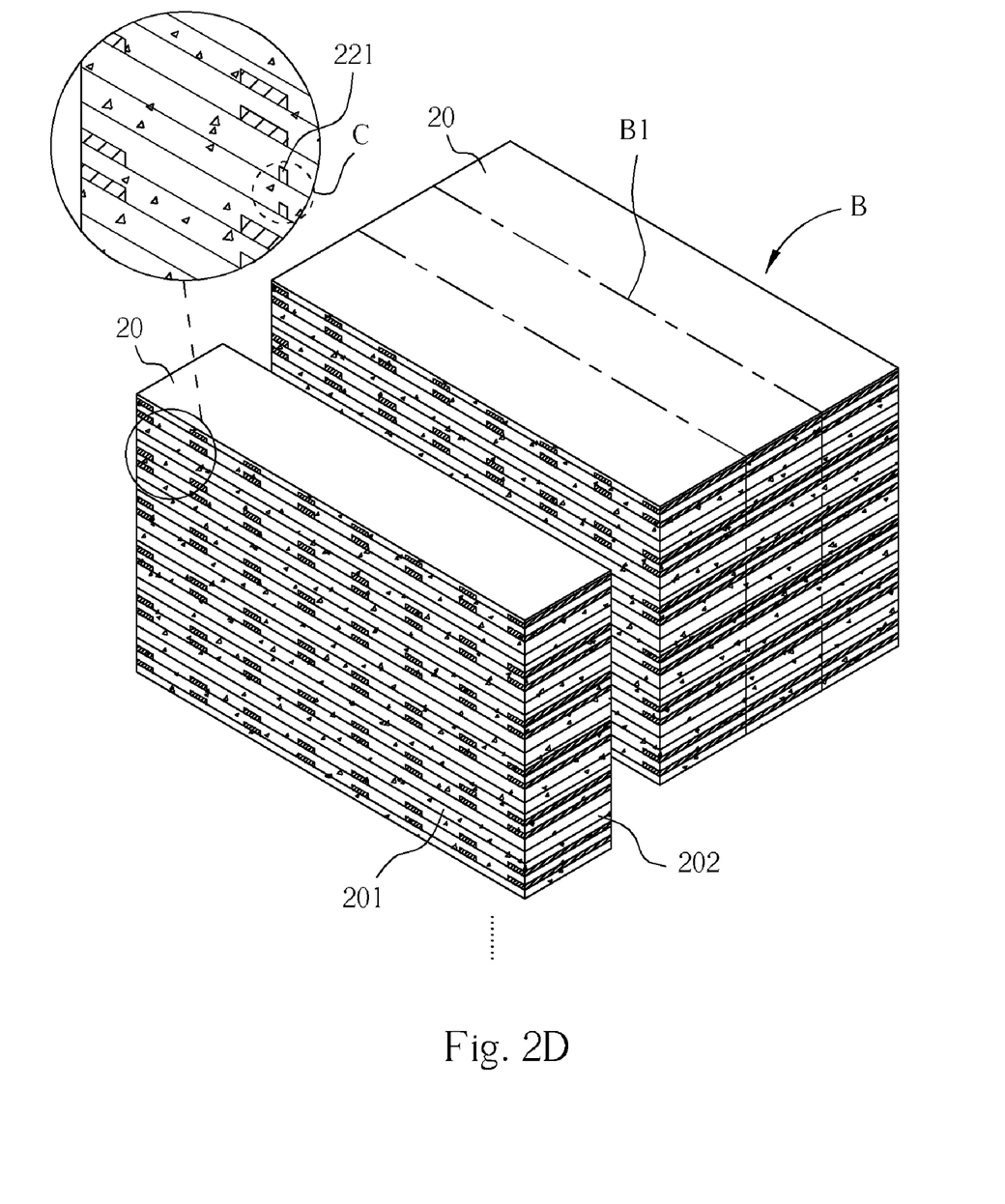

Next, as shown in FIG. 2C, the conductive layers 21 and the composite layers 22 are laminated to form a block B. The block B specifically defines a plurality of substrates 20 having vertically embedded capacitors and a plurality of sawing streets B1 between the substrates 20. Preferably, the size of the substrate 20 with vertically embedded capacitors can be adjusted according to the specification of the product. Thereafter, as shown in FIG. 2D, the block B is being sawed along the sawing streets B1 to singularize the substrates 20. Each of the singularized substrates 20 has a first surface 201 and a second surface 202, in which the first surface 201 and the second surface 202 expose the leading wires 211a and the electrodes 221a. The leading wires 211a and the electrodes 221a can be used to electrically connect at least a chip or a circuit device (not shown).

Figure 3:
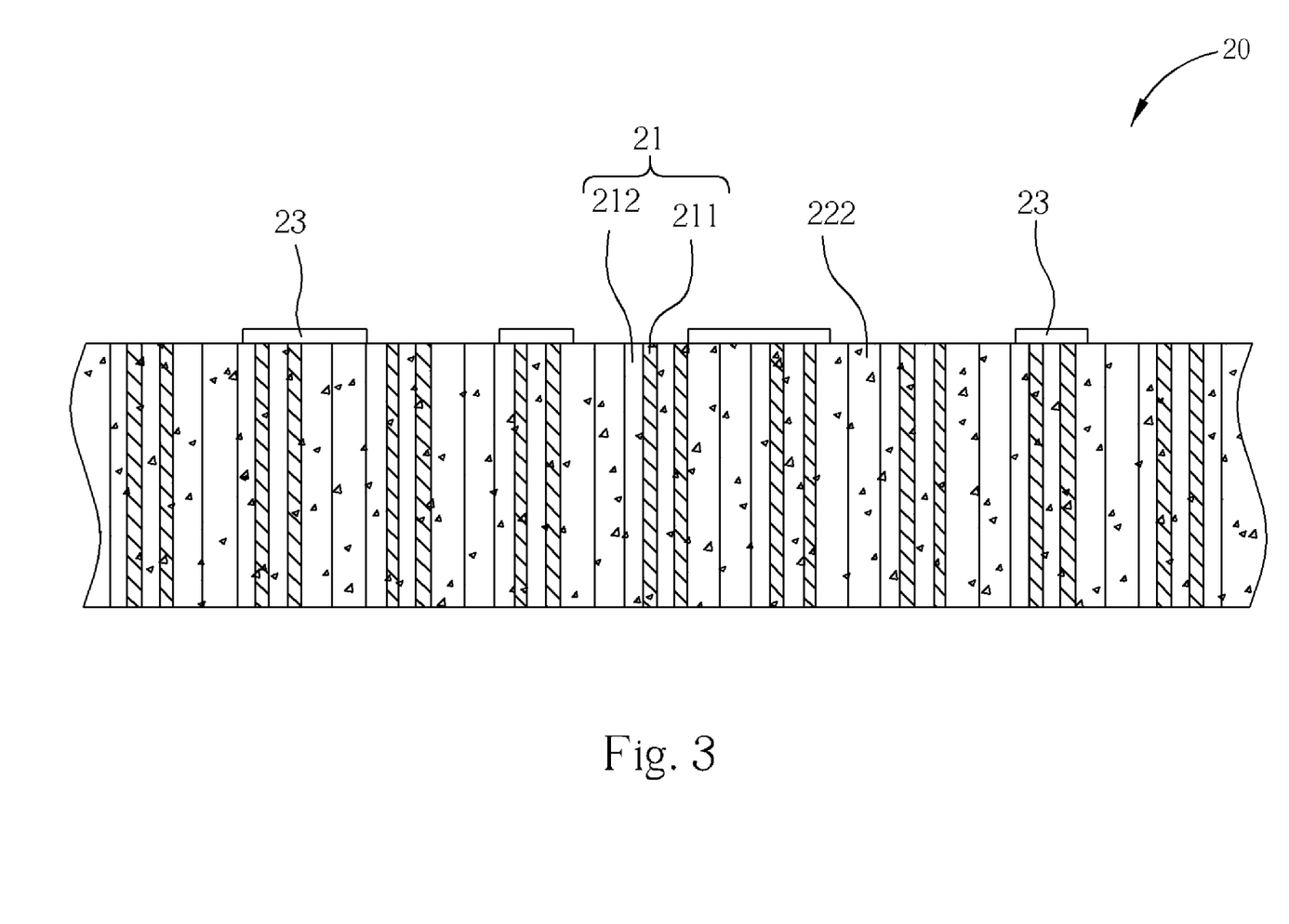
FIG. 3 illustrates a cross-section view of forming at least a wiring layer on the substrate with vertically embedded capacitors according to the first embodiment of the present invention.
Figure 4:
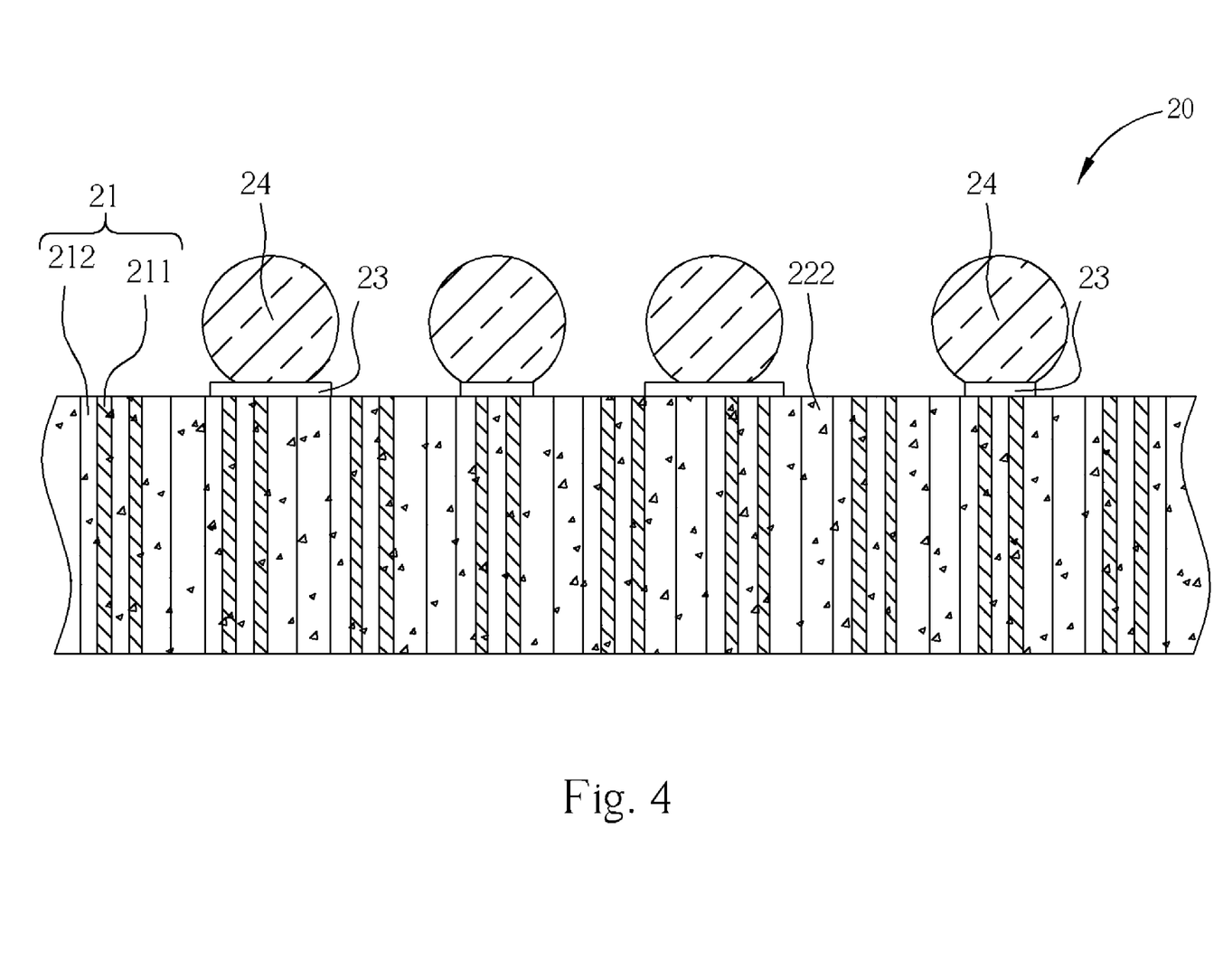
FIG. 4 illustrates a cross-section view of forming a plurality of bumps on the wiring layer according to the first embodiment of the present invention.

With reference to FIG. 3, at least a wiring layer 23 can also be formed on the first surface 201 and the second surface 202 of the substrate 20. Preferably, the wiring layer 23 can be utilized to establish a connection between the aforementioned chips, circuit devices and the substrate 20 by electrically connecting the leading wires 211a of the leading wire layer 211 and the electrodes 221a of the patterned electrode layer 221. Alternatively, as shown in FIG. 4, a plurality of bumps 24 can be formed on the wiring layer 23 to establish a connection between the chips and the substrate 20 with vertically embedded capacitors.

Figure 5A:
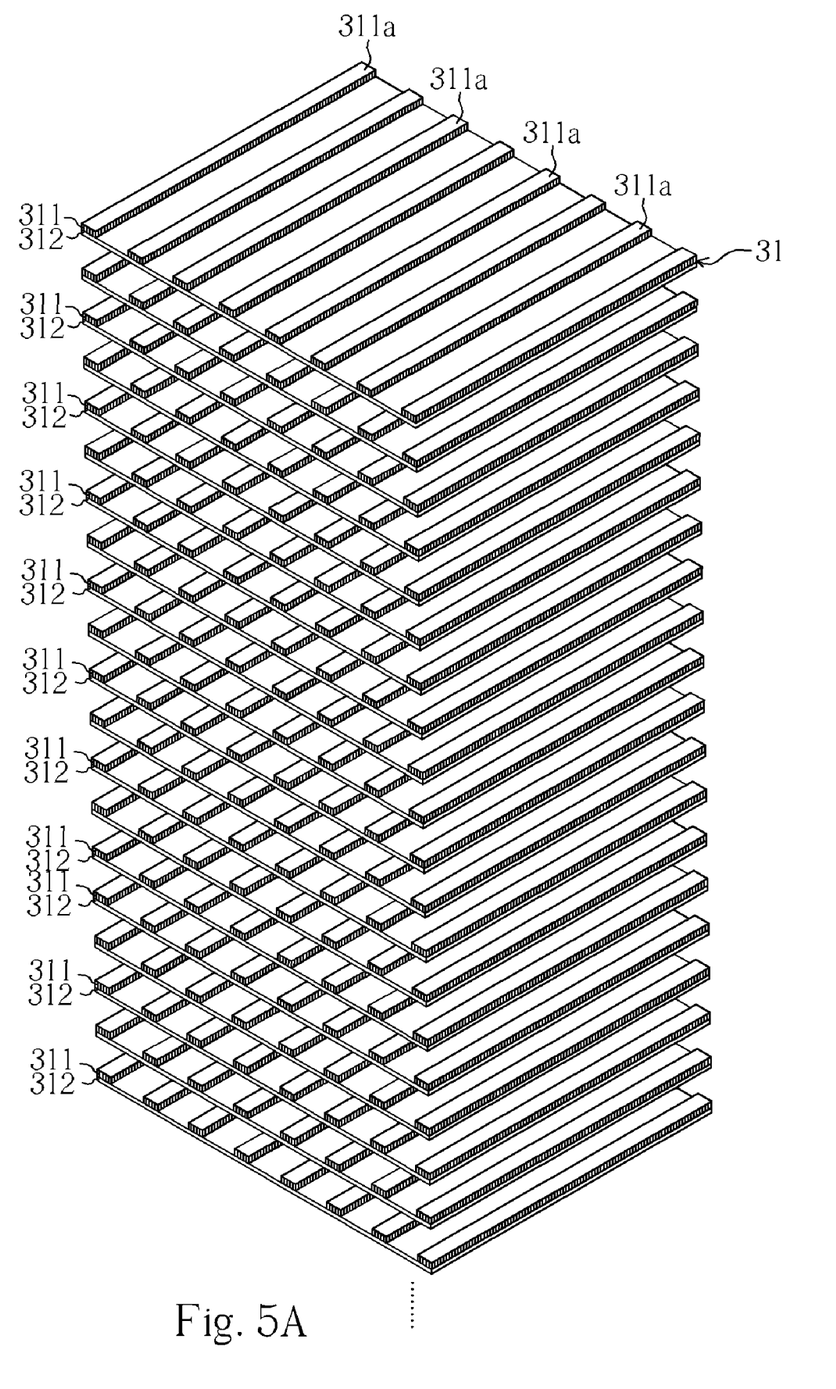
FIGS. 5A-5E illustrate a method for fabricating a substrate 30 with vertically embedded capacitors according to the second embodiment of the present invention.
Figure 5B:
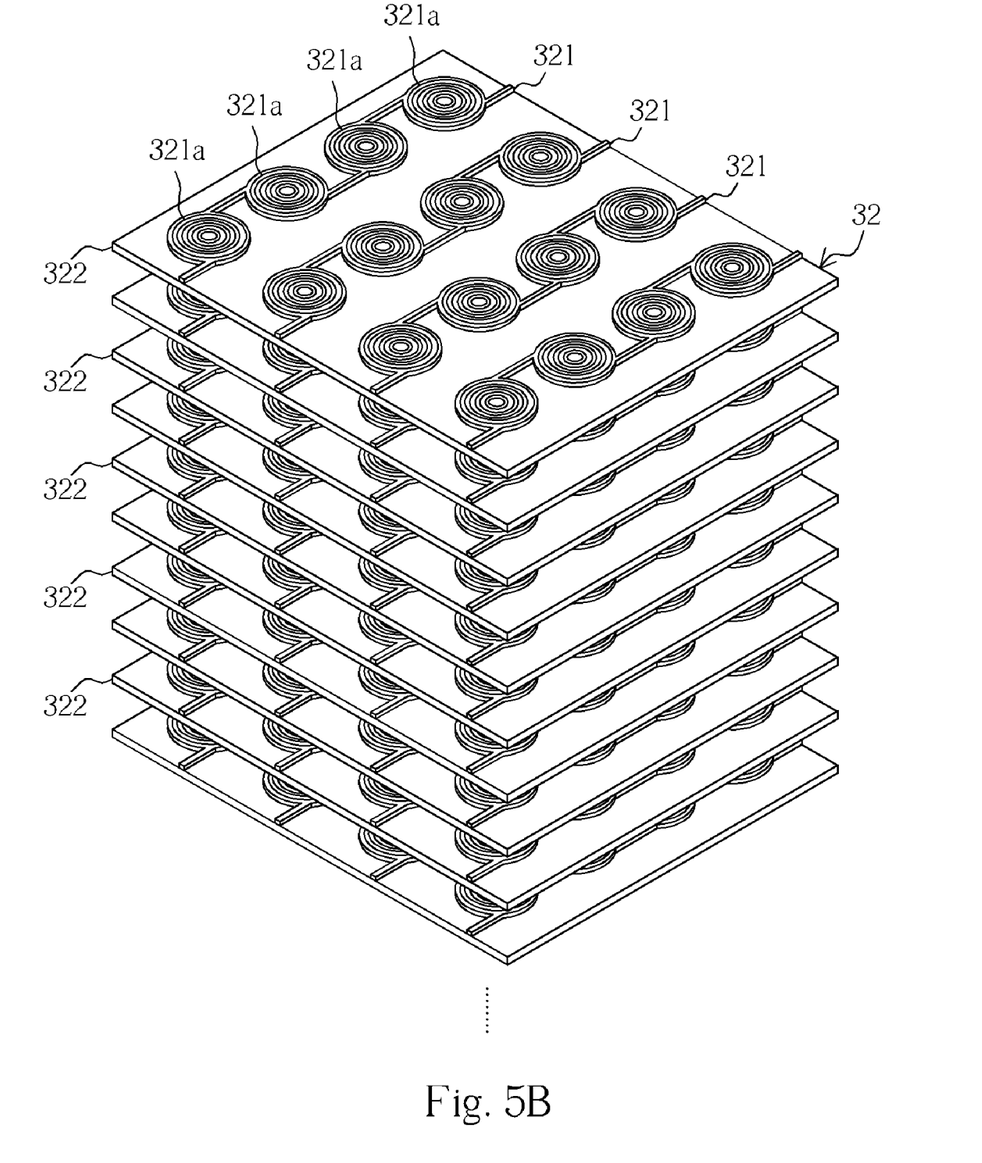
Figure 5C:
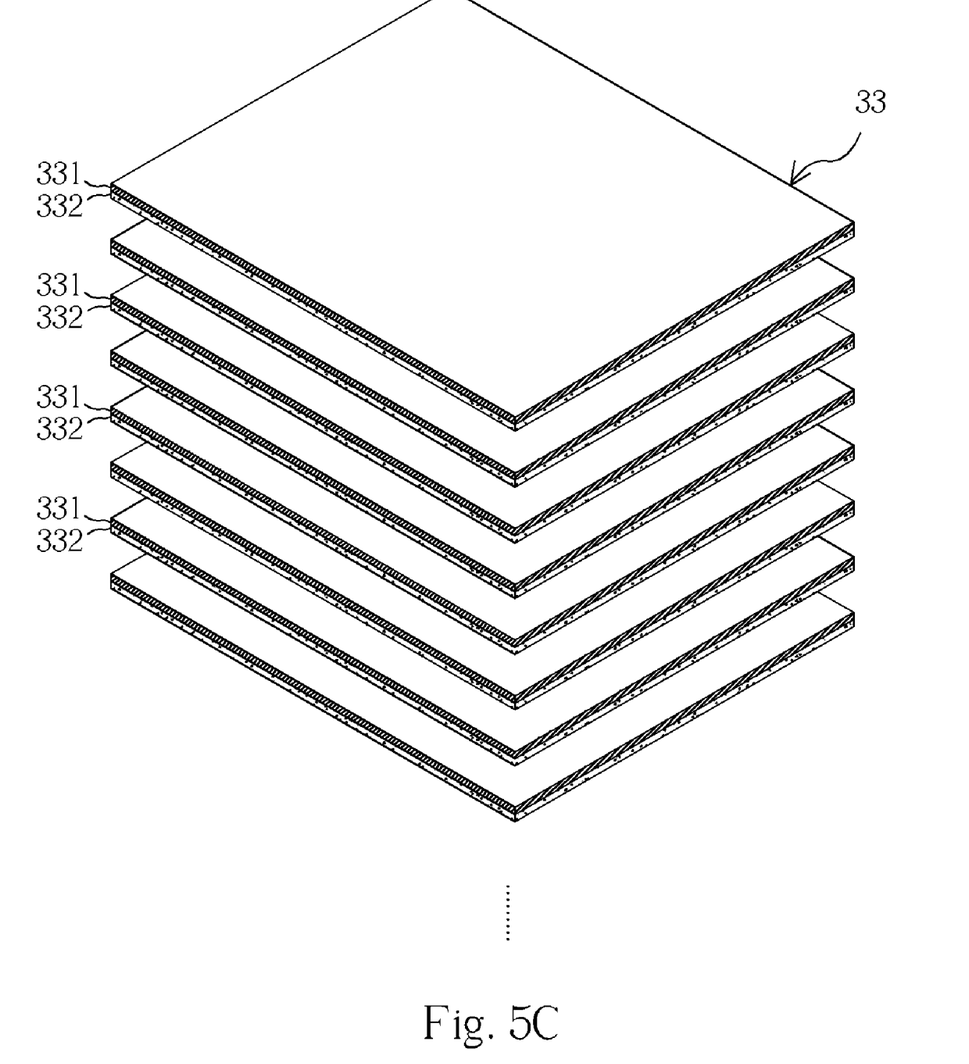
Figure 5D:
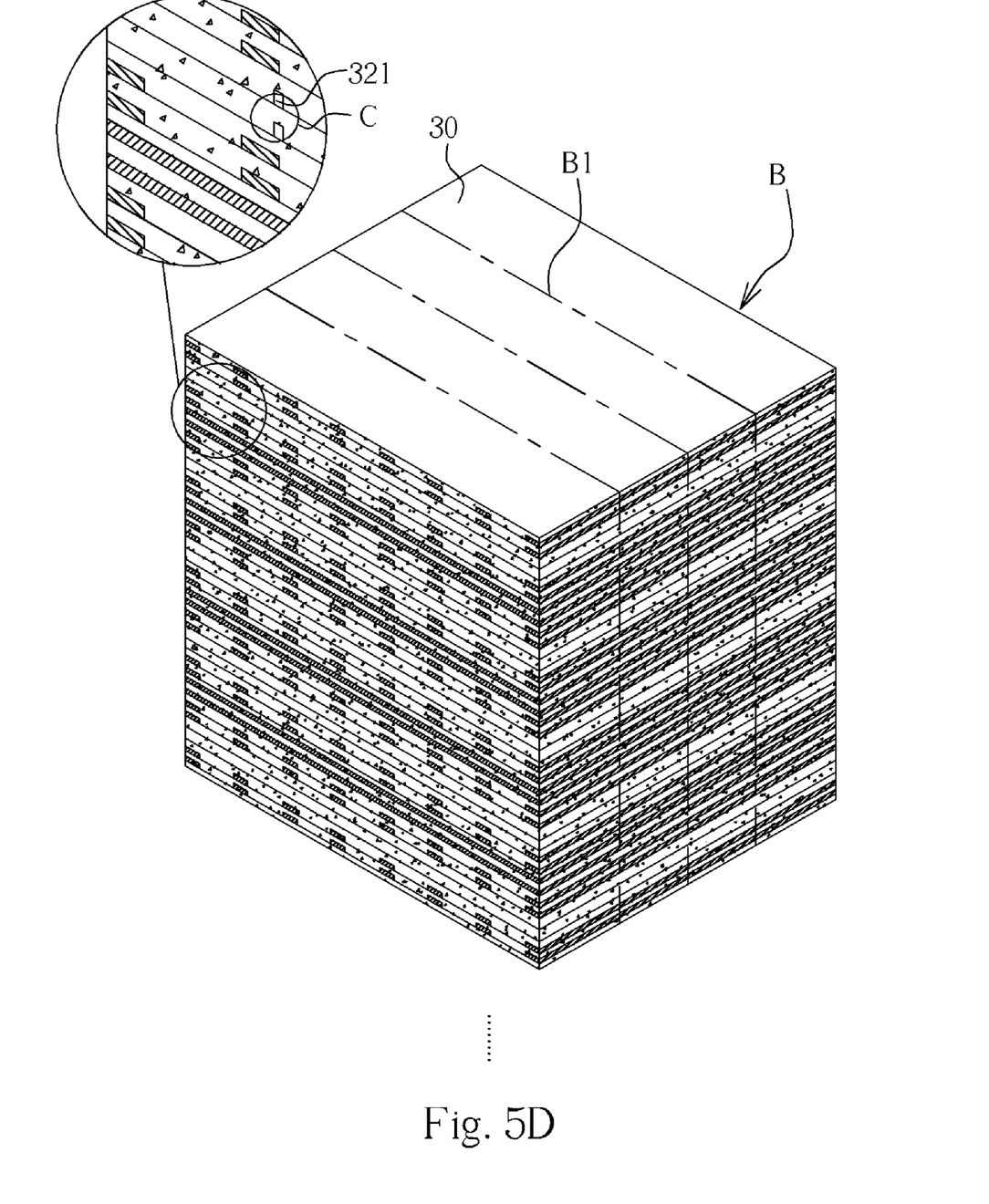
Figure 5E:
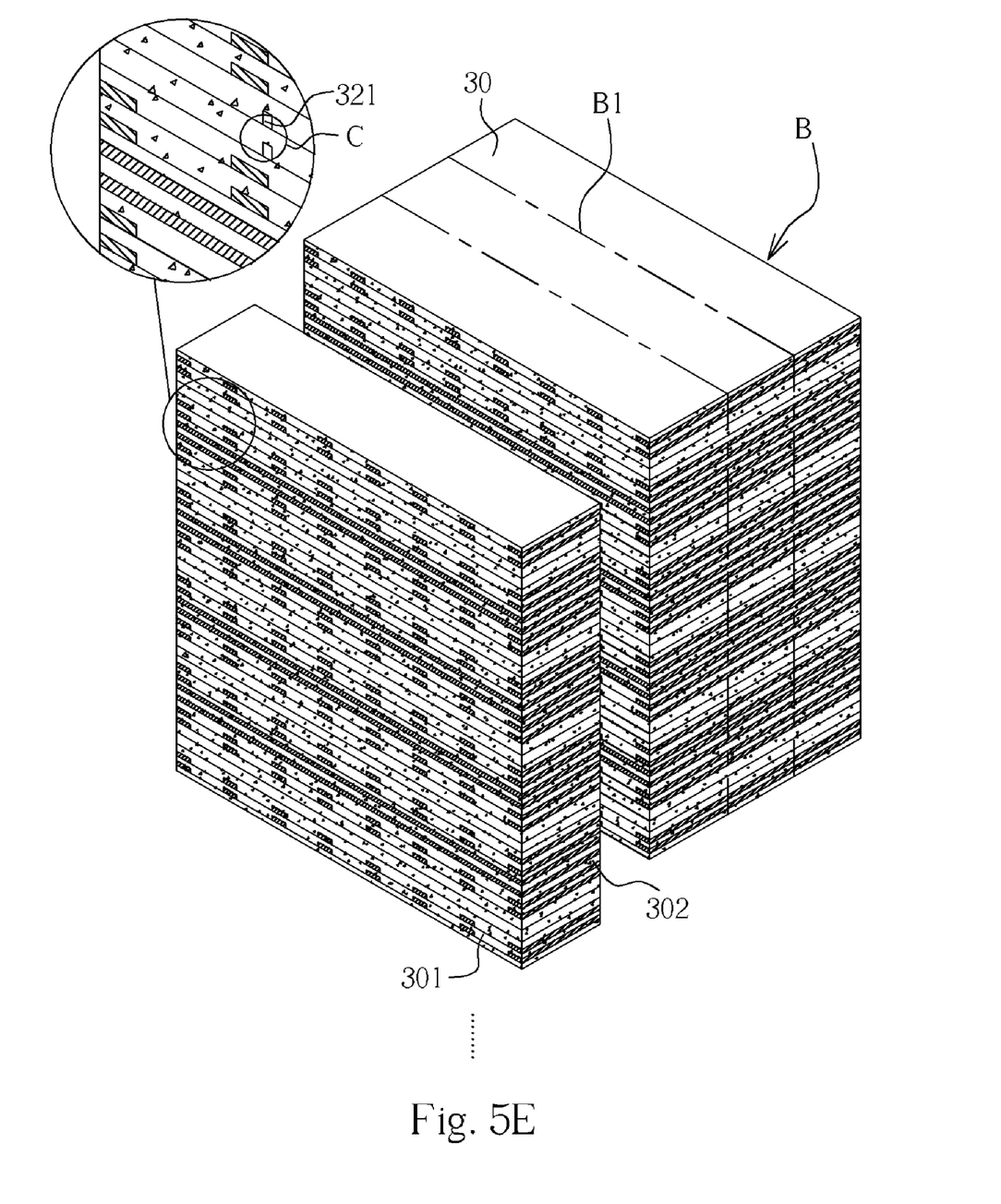

Please refer to FIGS. 5A-5E. FIGS. 5A-5E illustrate a method for fabricating a substrate 30 with vertically embedded capacitors according to the second embodiment of the present invention. As shown in FIG. 5A, a plurality of conductive layers 31 is provided, in which each of the conductive layers 31 includes a first dielectric layer 312 and a leading wire layer 311 formed thereon. The leading wire layer 311 is composed of a plurality of leading wires 31 1a. As shown in FIG. 5B, a plurality of first composite layers 32 is provided, in which each of the first composite layers 32 includes a second dielectric layer 322 and a patterned electrode layer 321 formed thereon. Preferably, each patterned electrode layer 321 includes a plurality of electrodes 321a and the electrodes 321a are arranged in an array. As shown in FIG. 5C, a plurality of second composite layers 33 is provided, in which each of the second composite layers 33 includes a third dielectric layer 332 and a sheet electrode layer 331 formed on the third dielectric layer 332. The third dielectric layer 332, the second dielectric layer 322, and the first dielectric layer 312 can be made of same or different material. Next, as shown in FIG. 5D, the conductive layers 31, the first composite layers 32, and the second composite layers 33 are laminated to form a block B. The block B specifically defines a plurality of substrates 30 with vertically embedded capacitors and a plurality of sawing streets B1 between the substrates 30. Subsequently, as shown in FIG. 5E, the block B is being sawed along the sawing streets B1 to singularize the substrates 30. Each of the singularized substrates 30 has a first surface 301 and a second surface 302, in which the first surface 301 and the second surface 302 expose the leading wires 31 1a, the electrodes 321a, and the sheet electrode layers 331. The leading wires 311a, the electrodes 321a, and the sheet electrode layer 331 can be used to electrically connect at least a chip or a circuit device (not shown).

Figure 6:
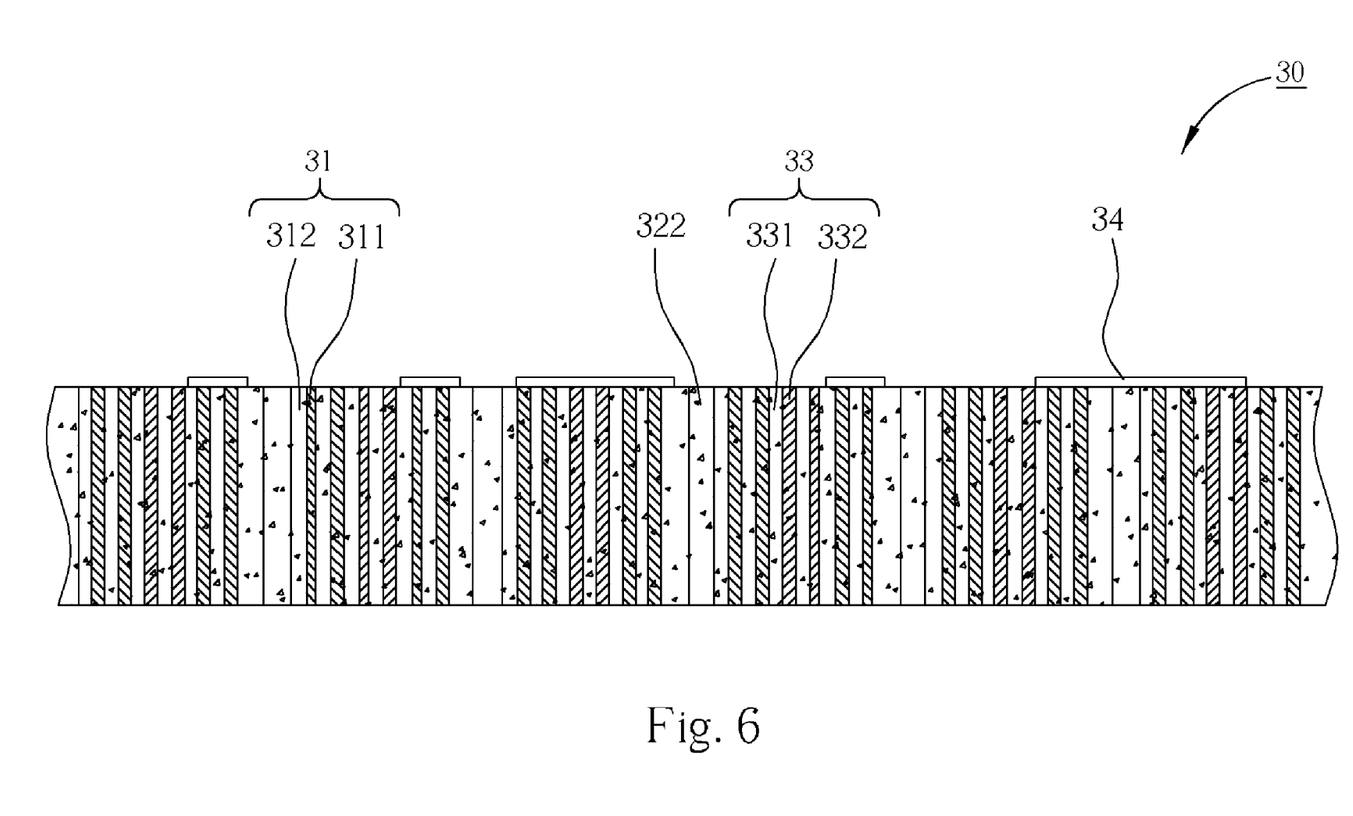
FIG. 6 illustrates a cross-section view of forming at least a wiring layer on the substrate with vertically embedded capacitors according to the second embodiment of the present invention.
Figure 7:
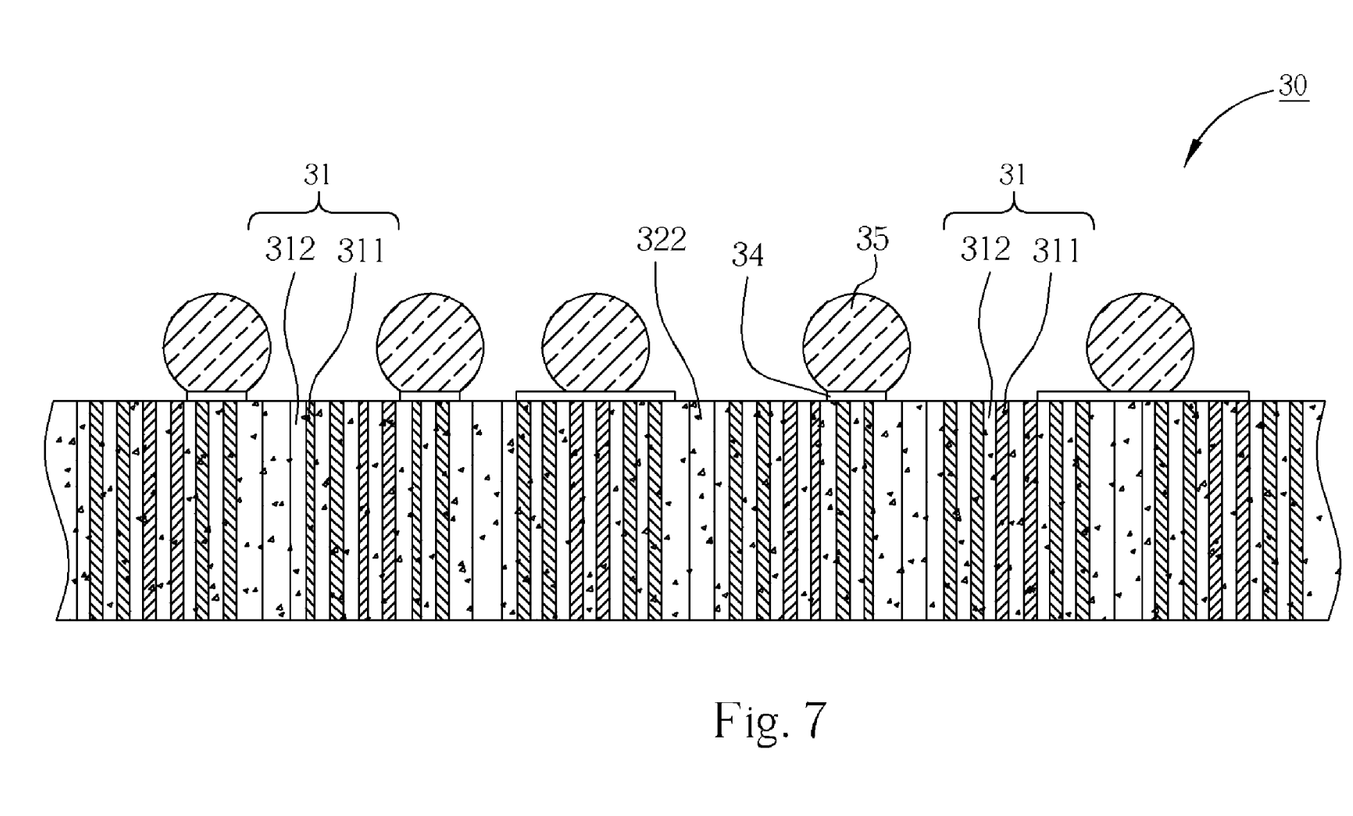
FIG. 7 illustrates a cross-section view of forming a plurality of bumps on the wiring layer according to the second embodiment of the present invention.

Referring to FIG. 6, at least a wiring layer 34 can be formed on the first surface 301 and the second surface 302 of the substrate 30 with vertically embedded capacitors. The wiring layer 34 is electrically connected to the leading wires 311a of the leading wires layer 311, the electrodes 321a of the patterned electrode layer 321, and the sheet electrode layer 331, such that the chips or the circuit devices can be electrically connected to substrate 30 through the wiring layer 34. Alternatively, as shown in FIG. 7, a plurality of bumps 35 can be formed on the wiring layer 34, such that the chip or the circuit devices can be electrically connected to the substrate 30 through the bumps 35.

FIGS. 5E and 6 further illustrate the structure of the substrate with vertically embedded capacitors of the present invention. As shown in the figures, the substrate 30 includes a plurality of conductive layers 31 and a plurality of first composite layers 32. Each of the conductive layers 31 includes a first dielectric layer 312 and a leading wire layer 311 formed on the first dielectric layer 312, in which the leading wire layer 311 is composed of a plurality of leading wires 311a. The first composite layers 32 are disposed between the conductive layers 31, in which each of the first composite layers 32 includes a patterned electrode layer 321 and a second dielectric layer 322. The patterned electrode layer 321 is composed of a plurality of electrodes 321a arranged corresponding to an array. In the present embodiment, the substrate 30 also includes a plurality of second composite layers 33 formed between the conductive layers 31, in which each of the second composite layers 33 includes a sheet electrode layer 331 and a third dielectric layer 332. Alternatively, the second composite layers 33 can be formed between the first composite layers 32, which are also within the scope of the present invention. By using the vertically embedded capacitors composed of the patterned electrode layers 321 and the second dielectric layers 322, or the sheet electrode layers 331 and the third dielectric layers 332, the present invention could expand the overall space for designing circuit layout and increase the flexibility of the design significantly. Moreover, this fabricating method also minimizes the need for adding external capacitors via surface mount technology, thereby reducing the overall volume and fabrication cost of the package.

Those skilled in the art will readily observe that numerous modifications and alterations of the device and method may be made while retaining the teachings of the invention.

What is claimed is:

1. A substrate with vertically embedded capacitors, comprising:
    a plurality of conductive layers having a first dielectric layer and a leading wire layer formed on the first dielectric layer, wherein the leading wire layer of every conductive layer is disposed on the first dielectric layer; and
    a plurality of first composite layers having a patterned electrode layer and a second dielectric layer, disposed between the conductive layers, wherein the patterned electrode layer comprises a plurality of electrodes.

2. The substrate with vertically embedded capacitors of claim 1 further comprising a plurality of second composite layers formed between the conductive layers, wherein each of the second composite layers comprises a sheet electrode layer and a third dielectric layer.

3. The substrate with vertically embedded capacitor of claim 2, further comprising a wiring layer electrically connected to the sheet electrode layer.

4. The substrate with vertically embedded capacitors of claim 1 further comprising a plurality of second composite layers formed between the first composite layers, wherein each of the second composite layers comprises a sheet electrode layer and a third dielectric layer.

5. The substrate with vertically embedded capacitor of claim 4, further comprising a wiring layer electrically connected to the sheet electrode layer.

6. The substrate with vertically embedded capacitors of claim 1, wherein the leading wire layer comprises a plurality of leading wires.

7. The substrate with vertically embedded capacitors of claim 1, wherein the electrodes are arranged in an array.

8. The substrate with vertically embedded capacitor of claim 1, further comprising at least one wiring layer on a first surface and a second surface of the substrate.

9. The substrate with vertically embedded capacitor of claim 8, wherein the wiring layer is electrically connected to the leading wire layer.

10. The substrate with vertically embedded capacitor of claim 8, wherein the wiring layer is electrically connected to the patterned electrode layer.

11. The substrate with vertically embedded capacitor of claim 8, further comprising a plurality of bumps on the wiring layer.

* * * * *